(12) United States Patent
Yee

(10) Patent No.: US 6,577,250 B1
(45) Date of Patent: Jun. 10, 2003

(54) RESISTANCE BASED KEYBOARD KEY DISCRIMINATION

(75) Inventor: Dawson Yee, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 09/574,216

(22) Filed: May 19, 2000

(51) Int. Cl.$^7$ ................................................ H03K 17/94
(52) U.S. Cl. ........................ 341/26; 345/178; 379/368; 341/34
(58) Field of Search .............................. 341/24, 22, 26, 341/34, 33; 379/368; 345/168, 178

(56) References Cited

U.S. PATENT DOCUMENTS

| | | | |
|---|---|---|---|
| 3,786,497 A | | 1/1974 | Davis et al. ................... 341/24 |
| 4,015,254 A | * | 3/1977 | Strandt ......................... 341/122 |
| 4,118,700 A | * | 10/1978 | Lenihan ......................... 307/100 |
| 4,222,038 A | * | 9/1980 | Magerl ........................... 341/26 |
| 4,580,138 A | * | 4/1986 | Morrison ....................... 340/524 |
| 4,667,181 A | | 5/1987 | Hastreiter ....................... 341/26 |
| 4,695,840 A | * | 9/1987 | Darilek ..................... 340/10.33 |
| 4,739,310 A | | 4/1988 | Yamamoto ..................... 341/25 |
| 5,448,236 A | * | 9/1995 | Shiga ............................. 341/25 |
| 5,521,575 A | * | 5/1996 | Pack .............................. 341/20 |
| 5,619,196 A | * | 4/1997 | Escobosa ................. 340/870.38 |
| 5,748,114 A | | 5/1998 | Koehn .......................... 341/22 |
| 5,877,709 A | | 3/1999 | Ala-Lehtimäki et al. ...... 341/26 |
| 6,178,388 B1 | * | 1/2001 | Claxton ......................... 341/22 |
| 6,222,466 B1 | * | 4/2001 | Uggmark ..................... 327/101 |

* cited by examiner

Primary Examiner—Michael Horabik
Assistant Examiner—Hung Q Dang
(74) Attorney, Agent, or Firm—Banner & Witcoff, Ltd.

(57) ABSTRACT

In place of a conventional n×m sense line/drive line matrix for keyboard key detection, discrimination between keyboard keys is carried out with one or more current divider or voltage divider circuits, with the result that the number of necessary IC pin connections may be reduced. The keyboard key switches are arranged into one or more current divider or voltage divider circuits. In a current divider embodiment, the key switches of each circuit are arranged in parallel with each other at respective points along a resistive switch line extending from Vcc to ground. When closed by key depression, the switches provide shortened paths from Vcc to ground, thus resulting in a current division effect. A voltage along the line is input to an A/D converter of a micro-controller which performs keyboard key discrimination. In a voltage divider embodiment, the key switches within a circuit are arranged in parallel with each other between (1) respective points along a resistive switch line extending from Vcc to ground; and (2) an A/D converter of a micro-controller. When the key switches are closed, the A/D converter senses the voltage at the respective switch. The sensed voltage varies in relation to the key that has been depressed, as a result of the voltage division, thereby allowing keyboard key discrimination to be carried out.

19 Claims, 7 Drawing Sheets

RESISTANCE BASED KEYBOARD KEY DISCRIMINATION

TECHNICAL FIELD

The present invention relates generally to keypad or keyboard data input devices (collectively referred to herein as "keyboards") used with general purpose computers and in a wide variety of application specific electronic devices. The invention has particularly useful application in connection with keyboards, e.g., computer keyboards, employing printed membrane switch structures.

BACKGROUND OF THE INVENTION

To a large extent, the computer industry has settled on using a n(row)×m(column) matrix of sense lines/drive lines for carrying out keyboard key switch discrimination. Such a matrix provides a means for an integrated circuit (IC) micro-controller device to decode n×m keys (e.g. 8×17=136 keyboard keys), with n+m electrical interface pins (e.g. 8+17=25 pins). The micro-controller device sequentially drives a voltage on a plurality of drive lines of the matrix. Keyboard key depression will effect a closure of an associated switch creating an electrical connection between a particular drive line and one of a plurality of sense lines, with the result that the micro-controller device will detect this voltage on the sense line and determine therefrom a corresponding alphanumeric character or function.

Typically, a membrane switch structure is used to form the keyboard key switch matrix. Referring to FIG. 1, a conventional computer keyboard 1 may utilize a conventional membrane switch structure 3, as shown in FIG. 2, which is installed underneath a set of keyboard keys 5. Membrane switch structure 3 generally has three layers 7, 9 and 11. Outer layers 7 and 11 sandwich intermediate layer 9. The three layers are generally made out of a thin insulative sheet of polyester (e.g., Mylar™) or other insulative material. Outer layers 7 and 11 each have, on their respective opposing inside surfaces 13 and 15, switch circuit patterns (17 and 19, respectively) which may be printed (e.g., silk-screened).

Circuit patterns 17 and 19 are appropriately laid out to provide contact points and lines of conduction for each of keyboard keys 5, within a conventional key switch matrix. The circuit patterns may be printed with suitable conductive inks, e.g., a polymer-based conductive ink having silver and/or carbon particles in suspension. Typically, each keyboard key 21 is coupled to a resilient or spring loaded plunger 23 positioned to make contact with a backside of upper outer layer 7 of membrane switch structure 3. Depression of selected ones of keyboard keys 5 causes a corresponding plunger 23 to exert pressure on upper outer layer 7. The resulting pressure causes a portion of electrical circuit 17 (e.g., a sense line) printed on the inner face of layer 7 to come resiliently into electrical contact with a portion of circuit 19 (e.g., a drive line) printed on the inner face of bottom outer membrane layer 11. This contact occurs through contact apertures 23 (one shown) provided in intermediate layer 9. The electrical contact allows passage of a drive signal on a particular sense line for input to an IC micro-controller device. By recognizing the sense line on which the signal is generated, and the timing of the appearance of the generated signal on the sense line, the IC can discriminate which of keyboard keys 5 has been depressed. The micro-controller device, in turn, provides a digital output signal readable by an associated computer.

FIG. 3 schematically illustrates a conventional arrangement of a computer keyboard switch circuit matrix 25 electrically connected with an IC die package 27 (typically mounted within the keyboard housing). In the conventional arrangement, a total of 17 drive lines 29 extend from IC die package 27 to corresponding drive lines 31 of switch circuit matrix 25. Drive lines 31 are laid-out in intersecting relationship with a total of eight sense lines 33. As previously described, and shown in FIG. 2, the drive lines are typically arranged on a first outer layer of a membrane switch structure, and the sense lines are typically arranged on a second outer layer of a membrane switch structure. This conventional arrangement requires IC die package 27 to accommodate a total of twenty-five (8+17=25) pin connections 35 spaced about the periphery of die package 27, for the signal (drive and sense) lines alone. Additional pin connections (not shown) must also be provided, e.g., for $V_{cc}$, Gnd, Osc, HostData and HostClk.

A silicon chip 37 centrally located within die package 27 contains IC logic (including the micro-controller device) for carrying out keyboard key discrimination and related functions. The logic circuitry integrated onto chip 37 is small relative to the available surface area of chip 37 and the high levels of integration attainable with available photolithographic IC fabrication techniques. A much smaller chip (and hence less silicon) could be utilized if it were not for the fact that a certain minimum size of chip 37 is required in order to accommodate pin connections 39 about the periphery of chip 37. Also, the area of chip 37 is small relative to the overall size of die package 27, due to the relatively large space requirements for making the pin connections 35 on the outer periphery of die package 27, as well as pin connections 39 located around the periphery of chip 37. But for the space required to accommodate the large number of required pin connections, the size of die package 27 could be reduced considerably, thus reducing the printed circuit board space required within the keyboard for accommodating die package 27. In addition, a reduction in the number of pin connections would reduce the materials and manufacturing costs associated with making the required pin connections.

SUMMARY OF THE INVENTION

The invention provides, in a first aspect, a resistance based keyboard key discrimination system capable of reducing the number of required pin connections to an IC die package. The system includes a plurality of keyboard keys and a switch circuit which may take the form of a current divider circuit or a voltage divider circuit. A plurality of key switches are arranged in the switch circuit to be selectively closed by actuation of corresponding ones of the keyboard keys, and in parallel with each other along a resistive switch line. A voltage source is provided for applying a voltage to the switch line. An A/D converter (A/D) is arranged to sense a voltage in the switch circuit that varies, as a result of resistances in the switch line, in relation to which, if any, of the switches are closed. The A/D outputs a digital value indicative of an actuated keyboard key, for input to logic circuitry of an IC micro-controller.

The switch circuit may include a membrane switch structure with lines of conduction provided (e.g., by silk-screening) on a layer thereof Resistivities of the lines of conduction may be varied by varying one or more of the composition, thickness, width and length of the lines of conduction.

In a second aspect, the invention provides a method of performing keyboard key discrimination in a resistance based keyboard key discrimination system, including a plurality of keyboard keys and a switch circuit. The switch circuit includes a plurality of key switches arranged along a resistive switch line to be selectively closed by actuation of corresponding ones of the keyboard keys. In the method, a voltage is applied to the switch line. A voltage in the switch circuit varies, as a result of resistances in said switch line, in relation to which, if any, of said switches are closed. That voltage is sensed, and a value indicative of an actuated keyboard key is output.

The above and other features and advantages of the present invention will be readily apparent and fully understood from the following detailed description of preferred embodiments, taken in connection with the appended drawings.

DETAILED DESCRIPTION OF THE PREFERRED EMBODIMENTS

Figure 1:
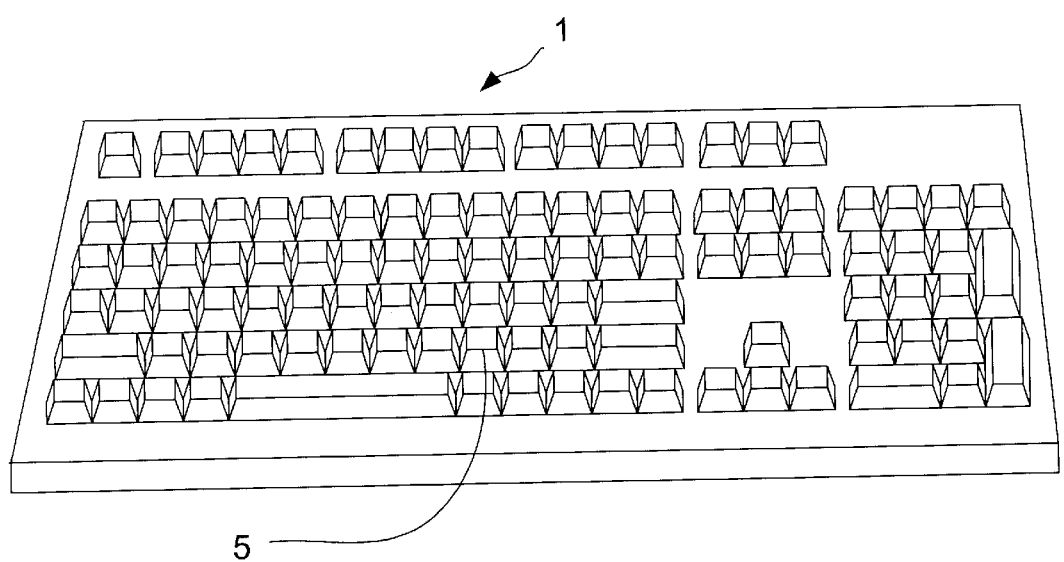
FIG. 1 is a perspective view of a conventional computer keyboard.
Figure 2:
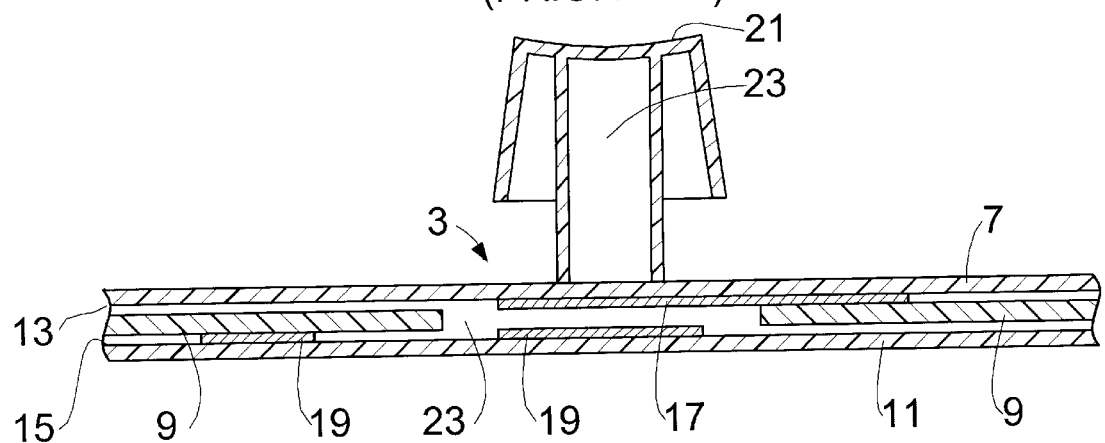
FIG. 2 is a cross-sectional view of a conventional three layer membrane switch structure, and associated keyboard key.
Figure 3:
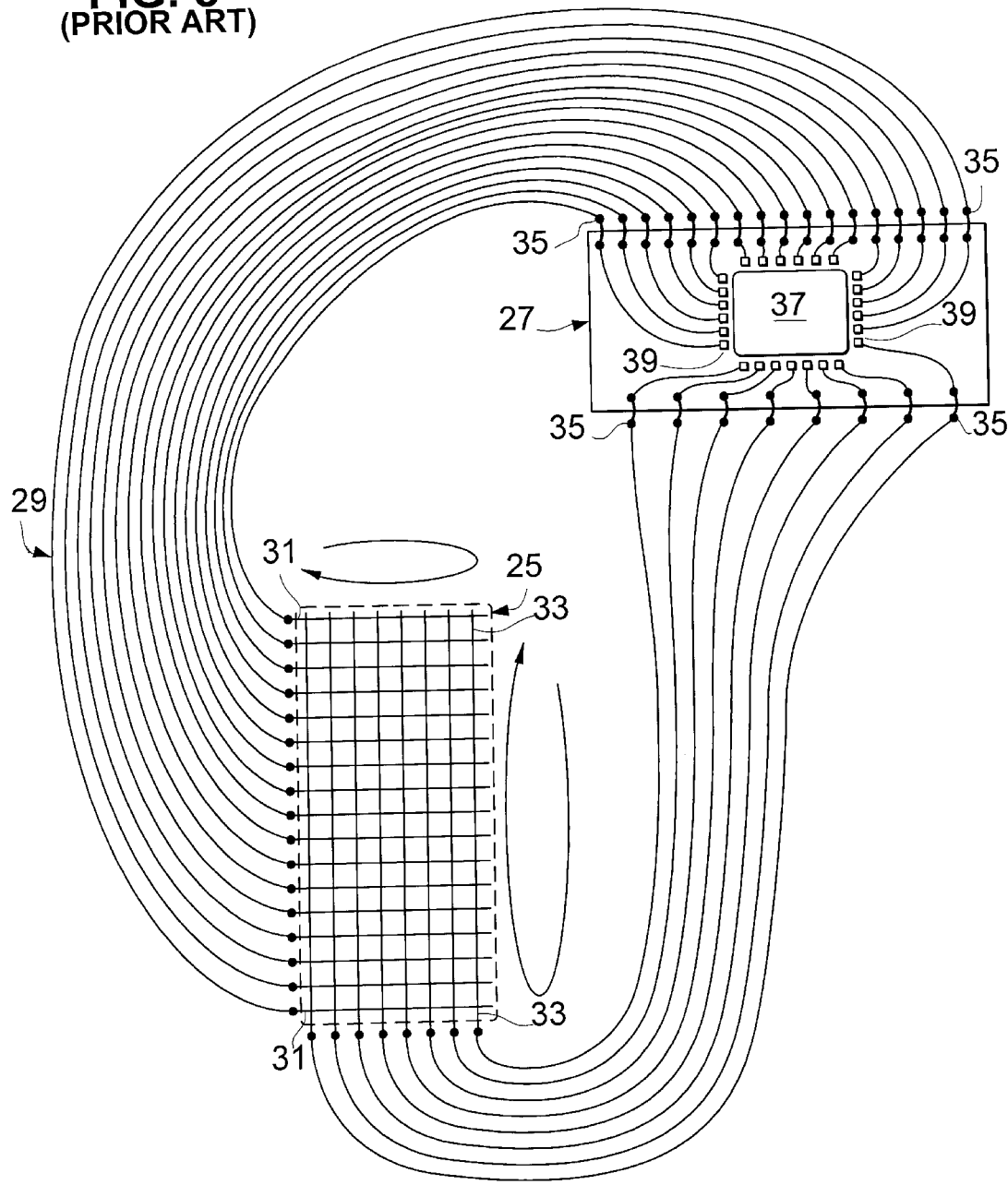
FIG. 3 is a schematic depiction of a conventional arrangement of a keyboard key switch circuit matrix in electrical connection with an IC die package.

In accordance with the invention, in place of a conventional 8×17 drive line/sense line matrix for keyboard key detection, discrimination between keyboard keys is carried out with one or more divider/calibration circuits. As a result, the number of necessary pin connections of an associated IC die package may be reduced. In the exemplary embodiment of FIG. 4, a total of four divider/calibration circuits 41 are connected to an IC die package 43 with a total of 8 pin connections 45 (for the signal lines). By comparison, a standard 8×17 drive line/sense line matrix requires 25 pin connections. In order to accommodate 136 keyboard key switches, each divider/calibration circuit 41 may contain a total of 34 key switches, arranged in a manner to be described. The number of separate divider/calibration circuits 41, and the number of key switches within each circuit, can be varied within certain constraints to be identified.

Figure 5A:
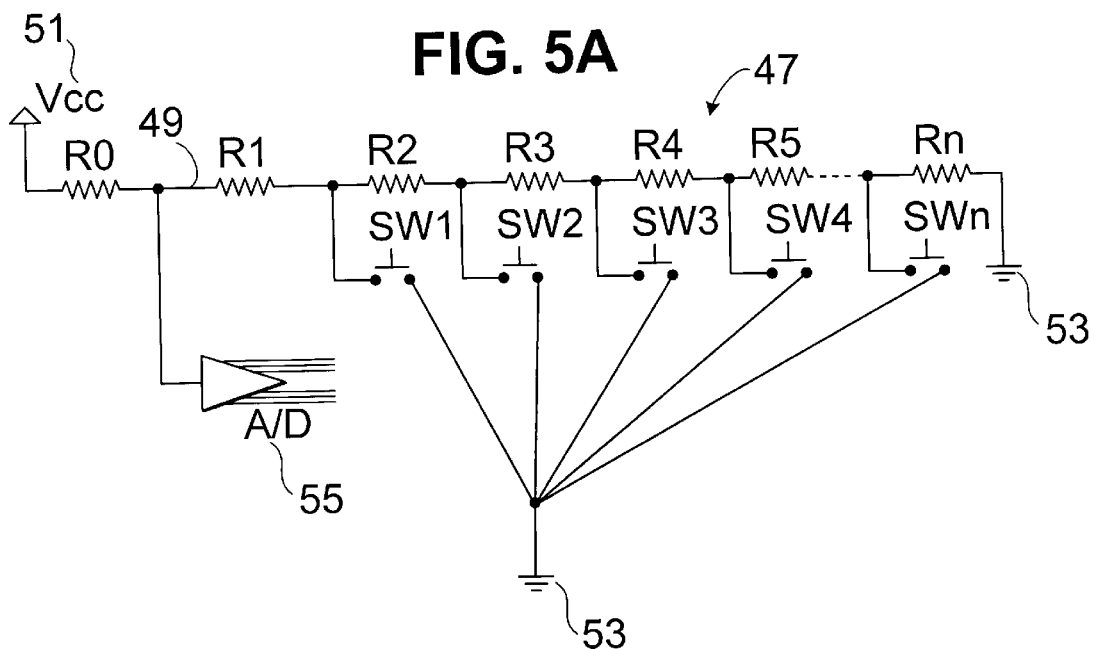
FIG. 5A is a schematic depiction of a resistive current divider circuit in accordance with a first embodiment of the invention.

Referring to FIG. 5A, in accordance with a first embodiment of the invention, a plurality of keyboard key switches SW1 . . . SWn are arranged into one or more current divider circuits 47. As can be seen, the key switches of each circuit 47 are arranged in parallel with each other at respective points along a resistive switch line 49 extending from Vcc 51 to ground 53. In a preferred embodiment, resistor values R0 . . . Rn represent the linear resistance of conductive polymer traces that are used for routing the switch circuit on a layer, e.g., polyester sheet, used for a membrane key switch structure. For a fixed thickness and width, the conductive polymer is linearly resistive and the resistance can be varied by varying the composition of the polymer (e.g., ratio of silver to carbon). Alternatively, the desired resistor values may be obtained with discrete resistors. A resistive current divider is created depending on which keyswitch is pressed (SW1 . . . SWn), permitting the detection of which (if any) key switch is depressed.

When depressed, switches SW1 . . . SWn provide shortened paths from Vcc to ground, thus resulting in a current division effect. A voltage along the line is input to A/D converter 55, which preferably is included in the IC 54 within die package 43 (see FIG. 4). That input voltage varies depending upon which of the switches SW1 . . . SWn in the line is depressed, in relation to the current division. A/D converter 55 converts the voltage into a digital value indicative of which, if any, of key switches SW1 . . . SWn has been depressed.

Figure 5B:
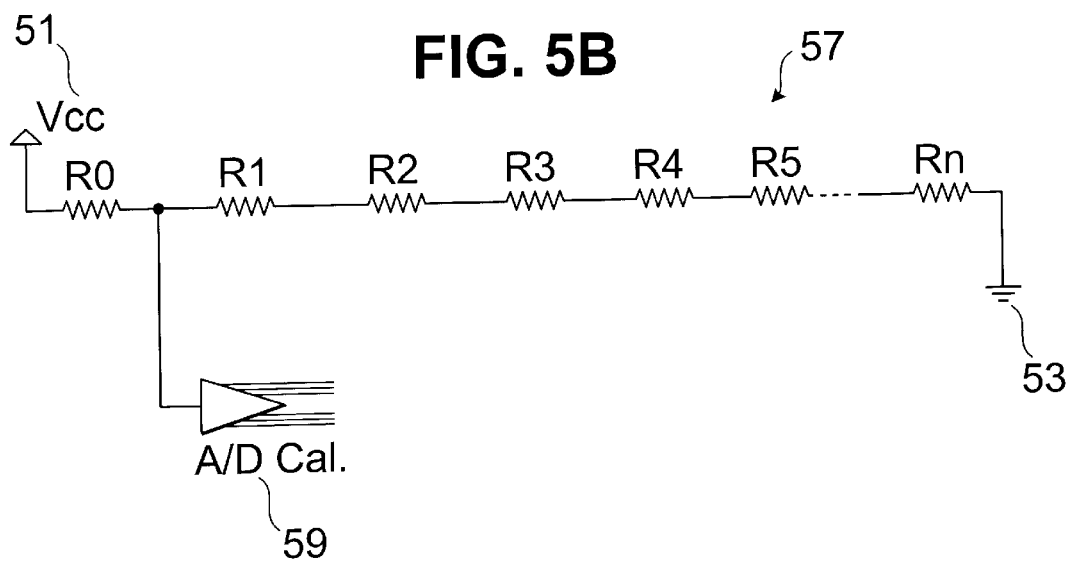
FIG. 5B is a schematic depiction of a calibration circuit that may be used with the resistive current divider circuit of FIG. 5A.

Referring to FIG. 5B, each current division switch circuit 47 can be paired with a calibration circuit 57 serving to avoid the need to know the discrete values of Vcc and the line resistances R0 . . . Rn. The need to pair a calibration circuit 57 with each switch circuit depends on how well each switch circuit 47 is duplicated in the overall system. The calibration circuit replicates Vcc and line resistances R0 . . . Rn of the corresponding switch circuit 47, and includes a second A/D converter (A/D Cal.) 59, arranged like A/D 55, to receive a reference voltage and output a digital value reflecting Vcc and the line resistances of switch circuit 47. So long as the resistor values in the calibration circuit 57 duplicate the resistor values in circuit 47 (within an acceptable tolerance), calibration circuit 57 provides "self" calibration to the system, removing dependencies on the absolute values of Vcc and each of the individual line resistance values.

Figure 4:
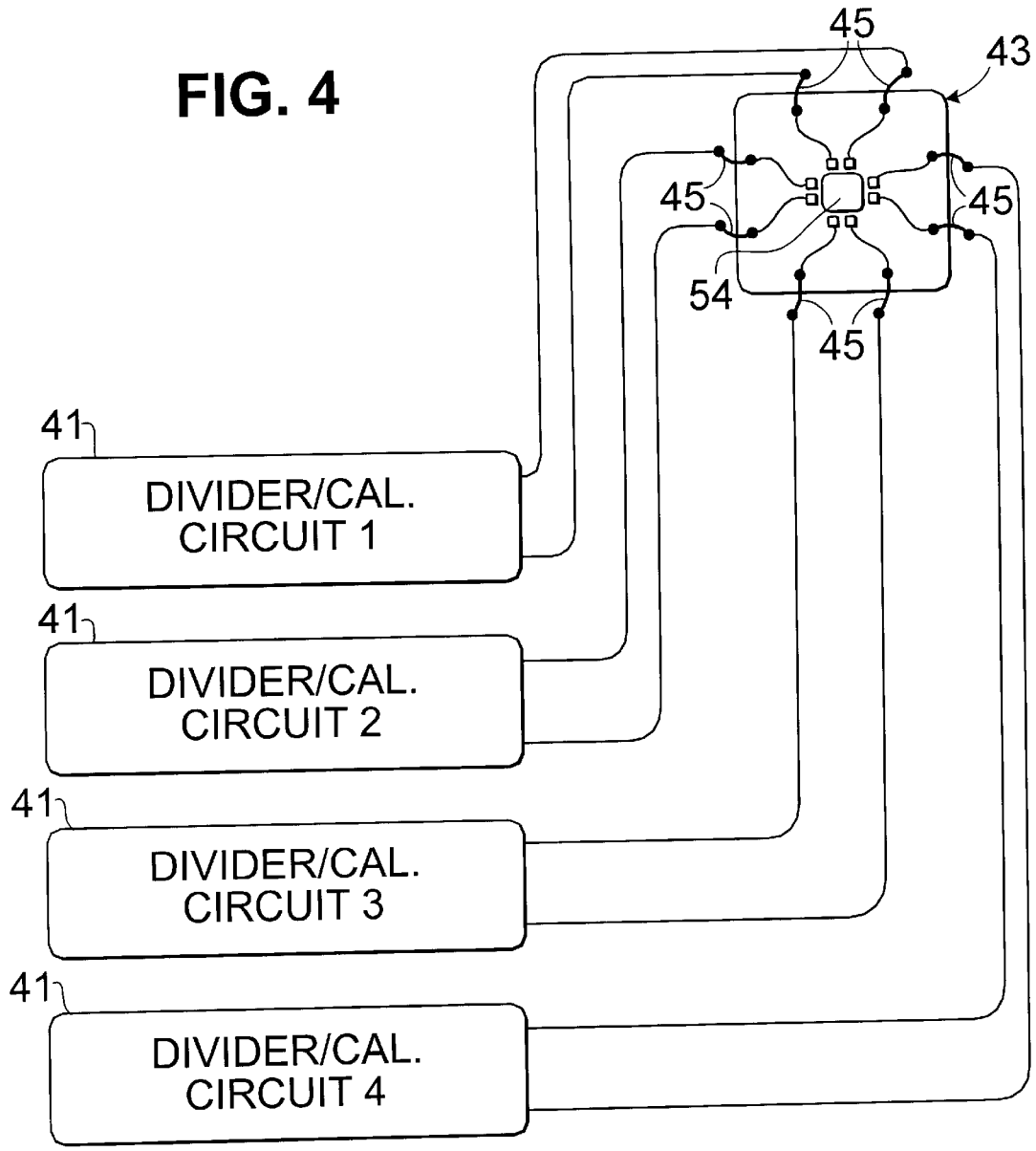
FIG. 4 is a schematic depiction of a resistance based keyboard key discrimination system in accordance with the present invention.
Figure 7:
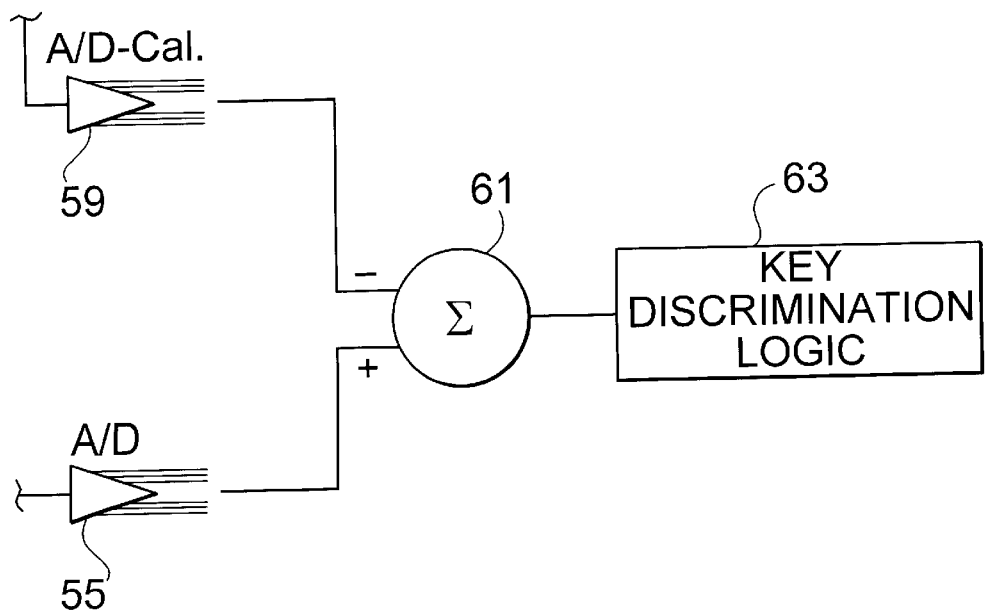
FIG. 7 is a schematic diagram illustrating a calibration functionality of the two embodiments of the invention illustrated in FIGS. 5A–6.

With reference to FIG. 7, the digital outputs of A/D 55 and A/D Cal 59 are summed in a summing circuit (summer) 61, and the resultant value is passed on to key discrimination logic 63 of the IC micro-controller. Such logic, which may be provided in the form of firmware or software, may included a look-up table (array) for matching the digital values output by summer 61 with a corresponding alphanumeric character or function. In the case that multiple divider/calibration circuits 41 are employed, as shown in FIG. 4, address identifications may be used to discriminate between the outputs of the respective summers 61.

As the number of switches SW1 . . . SWn per current division circuit 41 is increased, the required resolution of the A/D converters 55, 59 increases. At the same time, the permissible tolerance-range of the line resistances R0 . . . Rn decreases. This is because the steps between the voltages $V_{A/D}$ input to A/D 55 diminish as the distance (and hence resistance) between Vcc and the depressed switch increases. In particular, $V_{A/D}$ will vary as follows:

$$V_{A/D}=Vcc(R1+R2+R3+\ldots+Rx)/(R0+R1+R2+R3+\ldots+Rx)$$

where Rx is the line resistivity R associated with the Xth depressed switch SW.

For equal resistor values, the voltage at the A/D input when key-switch "n" is depressed is:

$$V_{A/D}=Vcc\{n/(n+1)\}=Vcc/\{1+(1/n)\}$$

The A/D input voltage become difficult to discern for "n" greater than about 5 when using equal value resistors. The steps between the voltages input to A/D converter 55 upon depression of key switches SW1 ... SWn may be increased by incrementing the line resistances between the respective key switches, thereby permitting use of lower resolution A/D converters. Using non-equal value resistors can improve (increase) the voltage steps with each key. As an example, the following resistance values may be provided in a five switch line:

| | | |
|---|---|---|
| R0 = 2 ohms | R1 = 4 ohms | R2 = 1.5 ohms |
| R3 = 2.5 ohms | R4 = 5 ohms | R5 = 12 ohms |
| R6 = 227 ohms | | |

Figure 8:
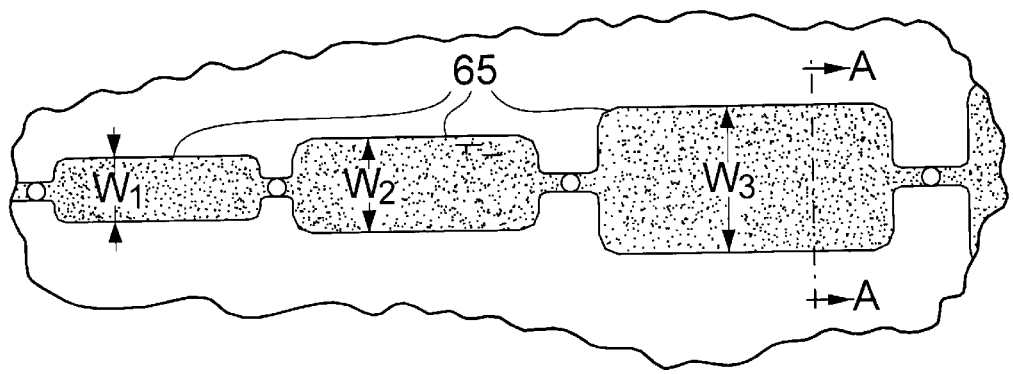
FIG. 8 is a partial plan view of a membrane switch layer in accordance with the invention, including a printed circuit pattern having circuit lines of the same length but with incremented widths between the switch points.
Figure 9:
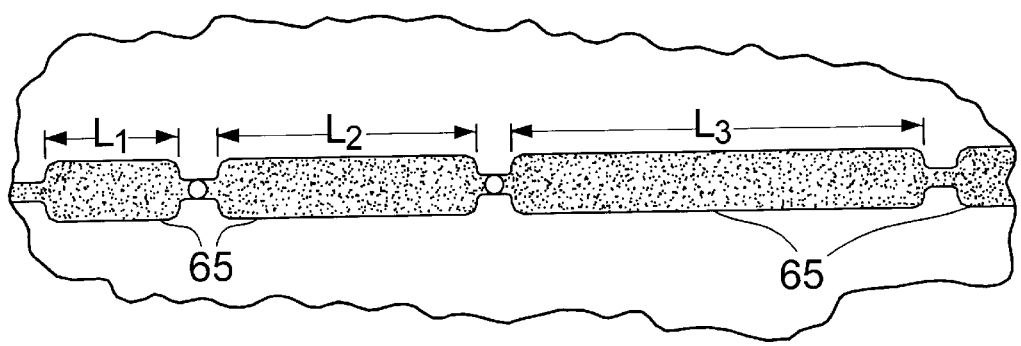
FIG. 9 is a partial plan view of a membrane switch layer in accordance with the invention, including printed circuit pattern having circuit lines of the same width but with incremented lengths between the switch points.
Figure 10:
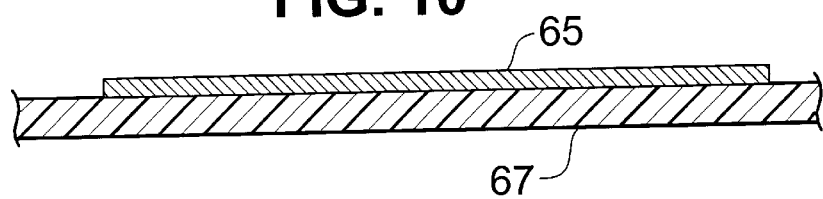
FIG. 10 is a cross-sectional view of the membrane switch layer of FIG. 8, taken on line A—A.

In this respect, the present invention can make advantageous use of the resistive nature of the conductive polymer based conductors (e.g., conductive ink) used to fabricate the membrane switch structures commonly used in keyboard design. As illustrated in FIGS. 8–10, line resistances may be varied by increasing/decreasing the width W (FIG. 8) or length L (FIG. 9) of the printed (e.g., silk-screened) polymer conduction lines 65 printed on a layer 67 (e.g., a polyester sheet) of a membrane switch structure. Alternatively, as mentioned, line resistances may be varied by varying the thickness and/or composition of the polymer-based ink used to print the conduction lines.

With the above-mentioned values of R0 ... R5, pressing the following key-switches produces the following A/D input voltage:

| | |
|---|---|
| SW1 | 0.67 Vcc |
| SW2 | 0.73 Vcc |
| SW3 | 0.80 Vcc |
| SW4 | 0.86 Vcc |
| SW5 | 0.93 Vcc |
| No key-switches | 0.99 Vcc |

As demonstrated, the voltage steps may be effectively increased by using non-equal (incremented) resistivities. However, additional care is required in the circuit fabrication process (e.g., silk-screening of the circuit pattern) to ensure that the required resistor values are maintained within permissible tolerances. It should be noted that the minimum resistance in the line should be set sufficiently high to act as an adequate safeguard during a high DC current situation created when the first key-switch (SW1) is depressed.

In accordance with a second embodiment of the invention, keyboard key discrimination is carried out with keyboard key switches arranged into one or more voltage divider circuits. As in the first embodiment, the result is that the number of necessary IC pin connections may be reduced.

Figure 6:
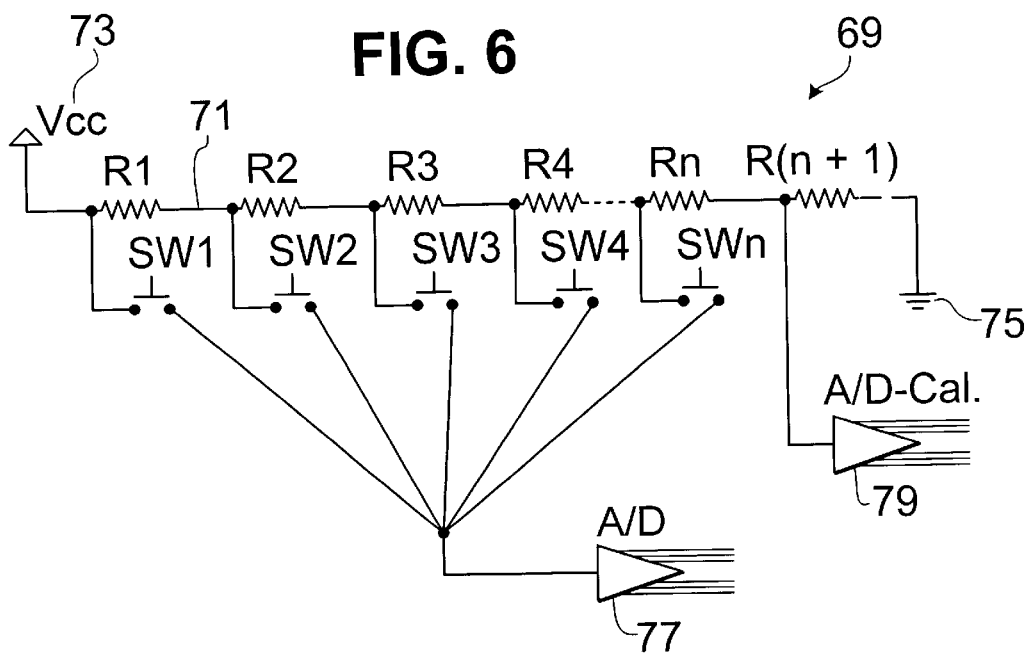
FIG. 6 is a schematic depiction of a resistive voltage divider circuit in accordance with a second embodiment of the invention.

Referring to FIG. 6, keyboard switches may be arranged into one or more voltage divider circuits 69, with the key switches SW1 ... SWn of each circuit arranged in parallel with each other between (1) respective points along a resistive switch line 71 extending from Vcc 73 to ground 75; and (2) an A/D converter 77, preferably included in the IC micro-controller device. When depressed, switches SW1 ... SWn allow A/D converter 77 to sense the voltage at the respective switch. The voltage input to A/D converter 77 varies depending upon which of the switches in the line is depressed, as a result of the voltage division. A/D converter 77 converts the input voltage into a digital value indicative of the keyswitch that has been depressed. Similar to the first embodiment, resistor values R1, R2, ... R(n+1) may represent the linear resistance of conductive polymer traces used for routing a switch circuit pattern on a layer (e.g., a polyester sheet) of a membrane switch structure. As previously mentioned, for a fixed thickness and width, such a conductive polymer is linearly resistive, and the resistance can be varied by varying the composition of the polymer (e.g., ratio of silver to carbon). The resistance of the conductive polymer may be used to create equal or unequal resistance values R1, R2, ... R(n+1). Alternatively, the desired resistor values maybe obtained using discrete resistors.

A second (calibration) A/D converter 79 is preferably connected to resistive switch line 71, in parallel to A/D 77. By receiving a reference voltage reflecting Vcc 73 and the line resistances R1 ... R(n+1) of circuit 69, calibration A/D 79 eliminates the need to know the discrete values of Vcc and line resistances R1 ... R(n+1).

As in the first embodiment, as the number of switches per circuit is increased, the required resolution of the A/D converters increases, and the permissible tolerance of the line resistances decreases. In the case of the voltage divider embodiment of FIG. 6, $V_{A/D}$ varies as follows:

$$V_{A/D}(\text{for the } x^{th} \text{ key pressed})=Vcc\{Rx+R(x+1)+\ldots+Rn+R(n+1)\}/\{(R1+R2+\ldots+Rn+R(n+1)\}\text{where } n>=x.$$

The stepwise variation in the voltage input to the A/D converter (upon depression of the key switches) may be increased by decrementing, from a high value to a low value, the line resistances R1 ... R(n+1) along switch line 71. As in the first embodiment, the line resistances may be varied by increasing/decreasing the width, length, thickness and/or composition of printed (e.g., silk-screened) polymer conduction lines 65 provided on a layer 67 of a membrane switch structure 67 (see FIGS. 8–10).

The tolerance of each resistor value limits the number of resistors that can be used in a given switch line 71. For example, with equal value resistors, a line with "n" resistors would require each resistor to maintain a resistance tolerance of less than 1/(n−1) in order for voltage divider circuit 69 to be able discern each resistor (key switch). For example, a 100 key switch line (with 101 equal value resistors) would require that each resistor maintain equal resistance to within 1%. Thus, a limiting factor for this approach is the ability to create equal (known) resistor values within a tolerance.

A principal cost savings benefit of the resistance based keyboard key discrimination systems of the present invention (both current division and voltage division) is the reduction of the number of necessary I/O pins connecting to the micro-controller, and associated savings in IC chip and die package size. The standard (n+m) I/O pins of a (n×m) matrix interface can, e.g., reduce to theoretically 2 input pins (1 pin for $V_{A/D}$ and the other pin for $V_{A/D}$cal), given sufficient tolerance of the resistance R values. In addition to pin savings, this reduction in the number of pins translates into a reduction of the printed circuit board (PCB) space required to mount the IC die package, as well as a reduction in the required number of I/O cells on the silicon (and associated testing). In addition, simplification of the layout of the key-switch circuit patterns on the membrane switch layers can be achieved. A further potential benefit is lowered EMI due to the non-switching of signals (keyboard matrix scanning is eliminated).

The present invention has been described in terms of preferred and exemplary embodiments thereof. Numerous other embodiments, modifications and variations within the scope and spirit of the appended claims will occur to persons of ordinary skill in the art from a review of this disclosure.

What is claimed is:

1. A resistance based keyboard key discrimination system, comprising:
   a plurality of keyboard keys; and
   a switch circuit, said switch circuit comprising a current division circuit including:
      a plurality of key switches arranged to be selectively closed by actuation of corresponding ones of said keyboard keys, and in parallel with each other along a resistive switch line;
      a voltage source for applying a voltage to said switch line;
      an A/D converter (A/D), said A/D arranged to:
         sense a voltage in said switch circuit that varies, as a result of resistances in said switch line, in relation to which, if any, of said switches are closed, and
         output a digital value indicative of an actuated keyboard key; and
      a calibration circuit arranged to replicate the line resistances of said switch line and the voltage applied thereto, said calibration circuit having a second A/D converter (A/D Cal.) for sensing a reference voltage reflecting the applied voltage and line resistances in said calibration circuit, and outputting a corresponding reference value.

2. A resistance based keyboard key discrimination system according to claim 1, wherein said switch circuit comprises a membrane switch structure.

3. A resistance based keyboard key discrimination system according to claim 1, wherein more than one said switch circuit is provided.

4. A resistance based keyboard key discrimination system according to claim 1, wherein resistive elements of differing resistance values are provided along said switch line.

5. A resistance based keyboard key discrimination system according to claim 1, further comprising a summing circuit for summing digital outputs of said A/D and A/D Cal., and outputting a calibrated digital value indicative of an actuated keyboard key.

6. A resistance based keyboard key discrimination system according to claim 1, wherein more than one said switch circuit and said calibration circuit are provided.

7. A resistance based keyboard key discrimination system according to claim 1, wherein incremented resistivities are provided along said switch line.

8. A resistance based keyboard key discrimination system according to claim 7, wherein said switch circuit comprises a membrane switch structure with lines of conduction provided on a layer thereof, and said resistivities are incremented by varying one or more of the composition, width and length of the lines of conduction.

9. A resistance based keyboard key discrimination system, comprising:
   a plurality of keyboard keys; and
   a switch circuit, said switch circuit comprising a voltage division circuit including:
      a plurality of key switches arranged to be selectively closed by actuation of corresponding ones of said keyboard keys, and in parallel with each other along a resistive switch line;
      a voltage source for applying a voltage to said switch line;
      an A/D converter (A/D), said A/D arranged to:
         sense a voltage in said switch circuit that varies, as a result of resistances in said switch line, in relation to which, if any, of said switches are closed, and
         output a digital value indicative of an actuated keyboard key; and
      a second A/D converter (A/D Cal.) for sensing a reference voltage reflecting the voltage applied to said switch line and the line resistances of the switch line, and outputting a corresponding reference value.

10. A resistance based keyboard key discrimination system according to claim 9, further comprising a summing circuit for summing digital outputs of said A/D and A/D Cal. and outputting a calibrated digital value indicative of an actuated keyboard key.

11. A resistance based keyboard key discrimination system according to claim 9, wherein more than one said switch circuit is provided.

12. A resistance based keyboard key discrimination system according to claim 9, wherein decremented resistivities are provided along said switch line.

13. A resistance based keyboard key discrimination system according to claim 12, wherein said switch circuit comprises a membrane switch structure with lines of conduction provided on a layer thereof, and said resistivities are decremented by varying one or more of the composition, width and length of the lines of conduction.

14. A method of performing keyboard key discrimination in a resistance based keyboard key discrimination system, the system comprising a plurality of keyboard keys and a switch circuit comprising a current division circuit including a plurality of key switches arranged along a resistive switch line to be selectively closed by actuation of corresponding ones of said keyboard keys, the method comprising:
   applying a voltage to said switch line;
   sensing a voltage in said switch circuit that varies, as a result of resistances in said switch line, in relation to which, if any, of said switches are closed; and
   outputting a value indicative of an actuated keyboard key;
   wherein said system further comprises a calibration circuit replicating line resistances of the switch line, said method further comprising applying a voltage to said calibration circuit that replicates the voltage applied to said switch circuit, sensing a reference voltage reflecting the applied voltage and line resistances in said calibration circuit, and outputting a corresponding reference value.

15. A method according to claim 14, further comprising summing outputs of said switch circuit and said calibration circuit to obtain a calibrated value indicative of an actuated keyboard key.

16. A method of performing keyboard key discrimination in a resistance based keyboard key discrimination system, the system comprising a plurality of keyboard keys and a switch circuit comprising a voltage division circuit including a plurality of key switches arranged along a resistive switch line to be selectively closed by actuation of corresponding ones of said keyboard keys, the method comprising:

applying a voltage to said switch line;

sensing a voltage in said switch circuit that varies, as a result of resistances in said switch line, in relation to which, if any, of said switches are closed;

outputting a value indicative of an actuated keyboard key; and sensing in said switch circuit a reference voltage reflecting the voltage applied to said switch line, and the line resistances of the switch line, and outputting a corresponding reference value.

17. A method according to claim 16, further comprising summing outputs of said switch circuit, including said reference value, and outputting a calibrated value indicative of an actuated keyboard key.

18. A resistance based keyboard key discrimination system according to claim 9, wherein said switch circuit comprises a membrane switch structure.

19. A resistance based keyboard key discrimination system according to claim 9, wherein resistive elements of differing resistance values are provided along said switch line.

* * * * *